(12) United States Patent
Wong et al.

(10) Patent No.: US 8,796,112 B2
(45) Date of Patent: Aug. 5, 2014

(54) GEOMETRY AND DESIGN FOR CONFORMAL ELECTRONICS

(71) Applicant: Palo Alto Research Center Incorporated, Palo Alto, CA (US)

(72) Inventors: William S. Wong, Waterloo (CA); Brent S. Krusor, Fremont, CA (US); Robert A. Street, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 13/931,622

(22) Filed: Jun. 28, 2013

(65) Prior Publication Data

US 2014/0000108 A1    Jan. 2, 2014

Related U.S. Application Data

(62) Division of application No. 12/253,390, filed on Oct. 17, 2008, now Pat. No. 8,492,876.

(51) Int. Cl.
*H01L 21/00* (2006.01)
*H01L 29/06* (2006.01)
*H05K 3/00* (2006.01)

(52) U.S. Cl.
USPC ......................... 438/462; 257/618; 40/124.14

(58) Field of Classification Search
CPC ............. H01L 2251/5338; H01L 27/14601; H01L 27/14603; H01L 27/14812; H01L 29/78603; H01L 51/0097; G09F 1/06; G09F 2013/222
USPC ........................................... 257/618; 438/462
See application file for complete search history.

(56) References Cited

U.S. PATENT DOCUMENTS

| | | | |
|---|---|---|---|
| 2004/0124763 A1 | 7/2004 | Nathan et al. | |
| 2007/0164223 A1 | 7/2007 | Hennessy et al. | |
| 2008/0151084 A1* | 6/2008 | Lu et al. | 348/294 |
| 2008/0151089 A1 | 6/2008 | Street et al. | |
| 2009/0184954 A1* | 7/2009 | Street | 345/419 |

* cited by examiner

*Primary Examiner* — Ha Tran T Nguyen
*Assistant Examiner* — Raj R Gupta
(74) *Attorney, Agent, or Firm* — Marger Johnson & McCollom PC

(57) ABSTRACT

A method of forming a three-dimensional electronic device includes forming at least one electronic device on a two-dimensional, flexible substrate, the electronic device being formed according to a three-dimensional structure, cutting the two-dimensional, flexible substrate, the cuts being located to allow the two-dimensional substrate to be shaped, the cuts having at least one stress relief feature, and shaping the two-dimensional, flexible substrate to form the three-dimensional structure, the stress relief features arranged to alleviate stress in the three-dimensional structure. A method of forming a three-dimensional electronic device includes forming at least one electronic device on a two-dimensional, flexible substrate, the electronic device being formed according to a three-dimensional structure, cutting the two-dimensional, flexible substrate, the cuts being arranged to as to increase a radius of curvature to meet a stress relief parameter when the substrate is shaped, and shaping the two-dimensional, flexible substrate to form the three-dimensional structure.

9 Claims, 4 Drawing Sheets

GEOMETRY AND DESIGN FOR CONFORMAL ELECTRONICS

CROSS REFERENCE TO RELATED APPLICATION

This divisional application claims the benefit of and priority to U.S. patent application Ser. No. 12/235,390, filed Oct. 17, 2008, which is incorporated herein in its entirety.

BACKGROUND

Image sensors and displays are generally formed from crystalline silicon substrates, thin films deposited on glass, or other somewhat rigid and brittle materials. These materials result in displays such as liquid crystal displays (LCD), and imaging arrays, such as charge-coupled devices (CCD), that are generally flat. Flat image sensors have limitations as to the field of view, and rely upon complex and expensive optical systems to widen the field of view, while a spherically curved sensor gives a wide field of view with simple optics. Curved displays may be required in certain applications depending on the positions from which it is intended to be viewed and the form of the structure that supports the display.

The ability to curve these arrays would allow for wide angle imaging systems, whether for sensing or viewing. Forming a curved array of pixels for either sensing or display gives rise to a number of issues. The advent of flexible electronics has made possible conical or cylindrical array surfaces, mostly based upon bending rectangular arrays. Formation of a spherical array is much more complex in several aspects, including manufacture, addressing, and image processing.

Some approaches of manufacturing conformal electronics manufacture the electronics on a flat, flexibly substrate and then make cuts to allow the substrate to bend to the desired shape. The process of bending the substrate may result in stress concentrations at points with very small curvatures that may cause cracking in the overlying films.

DETAILED DESCRIPTION OF THE EMBODIMENT

Figure 1:
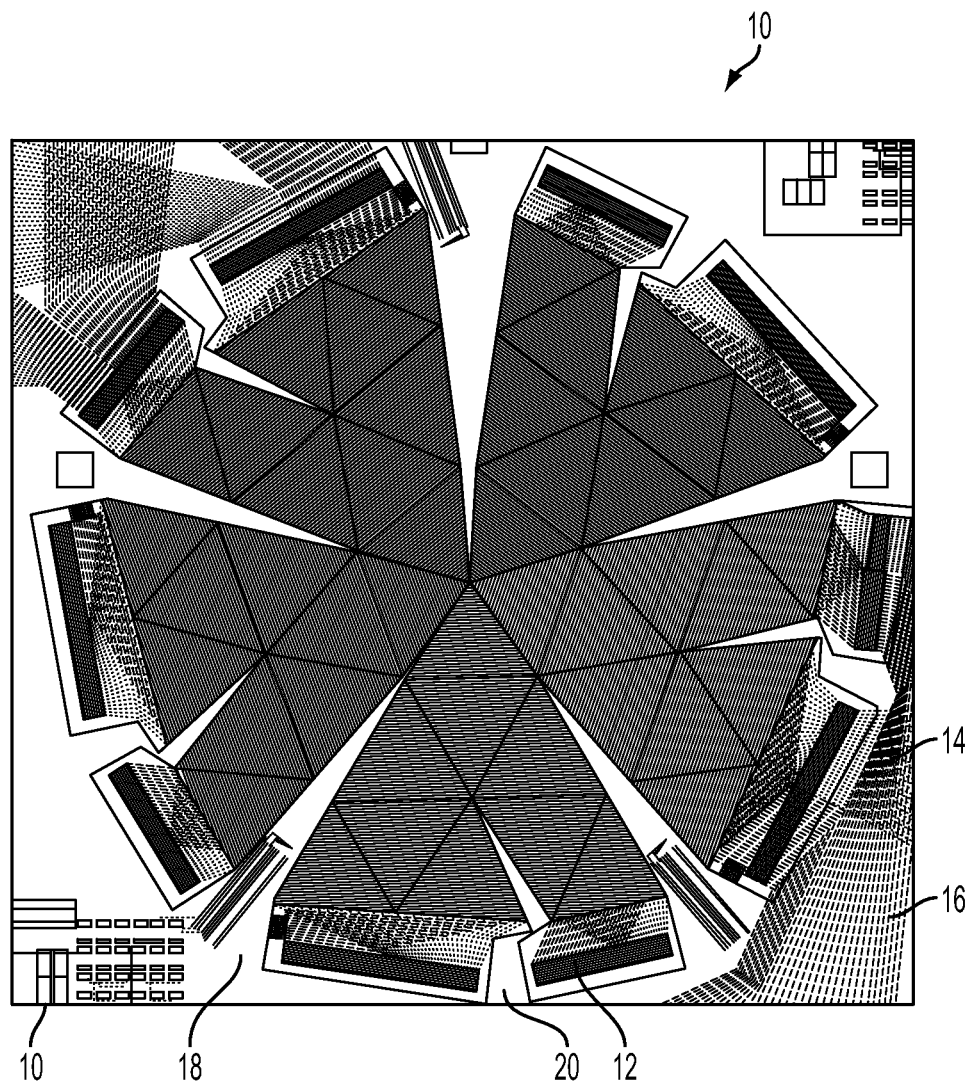
FIG. 1 shows an embodiment of an electronic device manufactured on a flat substrate and cut to form a three-dimensional structure.

FIG. 1 shows an embodiment of an electronic device intended to be formed into an approximately spherical shape. This electronic device 10 consists of an array of individual electronic elements, such as display pixels, associated memory elements, row and column select lines, etc. In this example, gate and data select lines 14 and 16 reside in the periphery of the device. Cuts, such as 18, divide the device into sections, in this example there are 5 sections. Additional cuts, such as 20, may also occur within the larger sections, as needed to allow the substrate to form the desired three-dimensional device. An example of such a device is shown in more detail in U.S. patent application Ser. No. 12/017,974, filed Jan. 22, 2008, "Design and Addressing of Three-Dimensional, Curved Sensor or Display Back Plane," which is incorporated by reference here in its entirety.

The formation of the two-dimensional device and its related cuts depends upon the desired three-dimensional structure into which the two-dimensional substrate will be formed. Generally, the substrate will be a flexible substrate that is bendable in order to achieve the desired three-dimensional structure. A laser may form the cuts, such as 18 and 20, and the material between them will generally be removed.

The cuts generally meet at some point, to allow the removal of material, while not going all the way across the substrate, allowing the device to retain sufficient structural integrity to form the three-dimensional device. The meeting point of these cuts, referred to here as the apex or vertex, cause local stresses when the substrate is bent into the desired shape, that may cause the substrate, or layers of the substrate, to crack or otherwise fail.

The angle of the cut is generally small, enabling a smooth curve in the formation of the three-dimensional structure. Examples of a three-dimensional structure that can be made by this technique may include domes, cylinders, cones, spheres, ellipsoids etc. and approximations to these shapes. Locally, near each apex formed by the pie-shaped sections such as 18 in FIG. 1, the shape of the substrate is a cone with a large angle. The radius of curvature, r, of the cone at distance R from the apex is $$r = R \tan \theta,$$

where $\theta$ is the half angle of the cone. The half angle is related to the pie-shaped cut sections according to the relationship $$2\pi \sin \theta = 2\pi - \phi,$$

where $\phi$ is the angle of the pie-shaped cut section or the angle between the two cuts. If $\phi$ is small, then $$\tan \theta = \text{sqrt}(\pi/\phi).$$

This leads to a radius of curvature then becomes $$r = \text{sqrt}(\pi R^2/\phi).$$

The mechanical stress in a thin film on a substrate is inversely proportional to the radius of curvature. For the cone formed locally near the apex of one of the cuts, the radius of curvature is zero at R=0 and the stress is therefore very large. Very large stress causes film delamination and other problems.

A value of R exists, however, at which the radius of curvature, r, becomes large enough to avoid any mechanical stress problems, at a distance from the apex R=a. Generally, for R<a the stress will generally be too large to avoid mechanical stress problems. Strategies exist for adding stress relief features at R=a to reduce the stress when the device is bent to shape.

Figure 2:
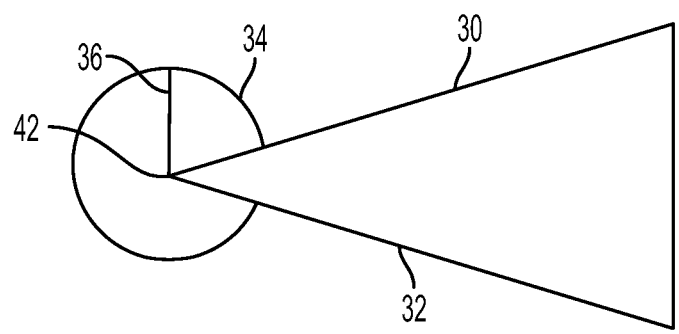
FIG. 2 shows an embodiment of a circular cut stress relief feature.

FIG. 2 shows one embodiment of a stress relief feature. In this embodiment, two cuts 30 and 32, separated by the angle $\phi$, meet at apex 42. The material between the two cuts is then removed. Around the apex, using the apex as a center, a laser or other cutting device forms a circular stress relief feature 34. In this particular embodiment, the circle 34 has a radius 36 equal to a. It must be noted that other values for the radius of the circle are of course possible and no limitation to any particular radius is intended nor should it be implied.

Figure 3:
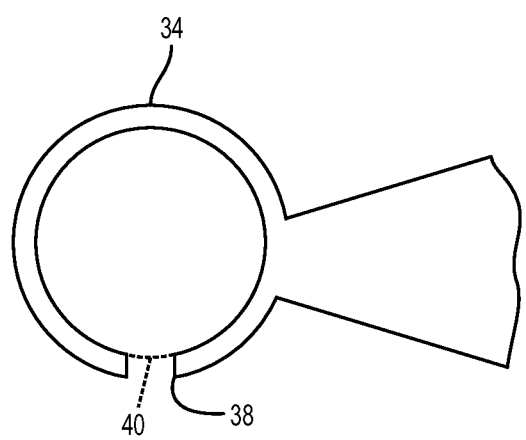
FIG. 3 shows an embodiment of a circular cut stress relief feature with retained material.

Many variations on the formation of the circular feature exist. For example, as shown in FIG. 3, a portion 40 of the circular feature 34 may not receive a cut, and the material internal to the circle may remain. This may allow formation of a 'bridge' structure 38 to the main structure. The bridge structure may allow connection between components or elements within the circle 34 to other components or elements on the main structure. When retained the disc-shaped circle will lay flat when the substrate is formed into its three-dimensional device.

Figure 4:
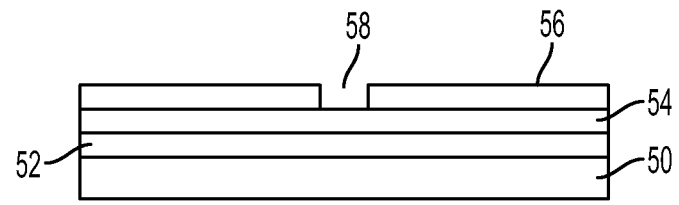
FIG. 4 shows a side view of a cut formed by partial removal of material.

Another variation would be to cut the circle, but only through a brittle layer or film that is prone to cracking or in which the stress problems reside, leaving the underlying material intact. This variation is shown with regard to the circular feature here, but may apply to any of the embodiments presented here. FIG. 4 shows a side view of a partially-cut stress relief feature, whether the circular feature or other features discussed here.

In FIG. 4, the flexible substrate 50 has formed upon it 'functional' layers, such as the metal and dielectric layers that form the interconnections that allow the electronic device to operate. Layers 52 and 54 represent the functional layers in FIG. 4, with the understanding that many more or fewer layers may exist. Layer 56 represents a brittle layer that cracks or otherwise has mechanical stress problems for small radii of curvature. Layer 56 may actually consist of several layers. The formation of the stress relief feature would not cut all the way through the substrate, except as necessary for the removal of the material, but would instead cut only through the brittle layer. These cuts would avoid any functional components in the brittle layer or layers. Cut 58 of FIG. 4 shows an example of such a cut.

Figure 5:
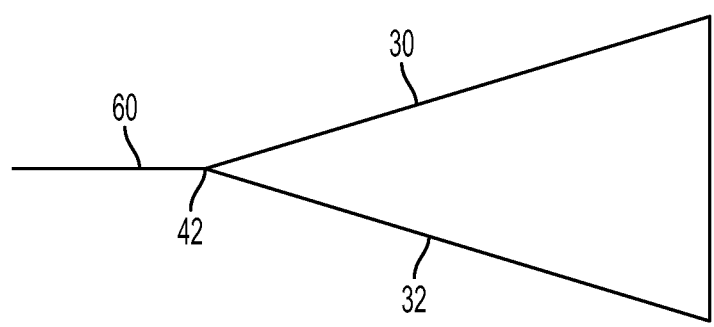
FIG. 5 shows an embodiment of an extended cut stress relief feature.

The partial cutting of the substrate to form the stress relief feature may occur for any type of stress relief feature, such as the circular feature of FIG. 2, as well as an extended cut feature of FIG. 5. FIG. 5 shows an extended cut stress relief feature. The two lines 30 and 32 meet at the apex 42. A cut line 60 is extended from the apex 42. The cut line does not result in the removal of any additional material, other than that material removed by the cut itself. This cut line may be an extension of one of the other cut lines 30 and 32, or it may have a different trajectory through the substrate. Extending one or the other cut lines 30 and 32 may result in asymmetrical stress distribution, so a line with a different trajectory, symmetrical between the two cut lines, may work better.

In addition, the extended cut feature may consist of a partial cut, as described above. This may allow the remaining flexible substrate to act as a support for the overlying film. The extended cut also provides a large surface area to allow defects to terminate. Termination of a defect means that the defect, such as a crack, stops at the extended cut, rather than continuing on further across the substrate.

In experiments, the stress relief designs illustrated in FIGS. 2 and 5 each provided large enough stress relief that no microcracking was observed after assembling the three-dimensional structure. This particular experimental structure was a geodesic dome.

Figure 6:
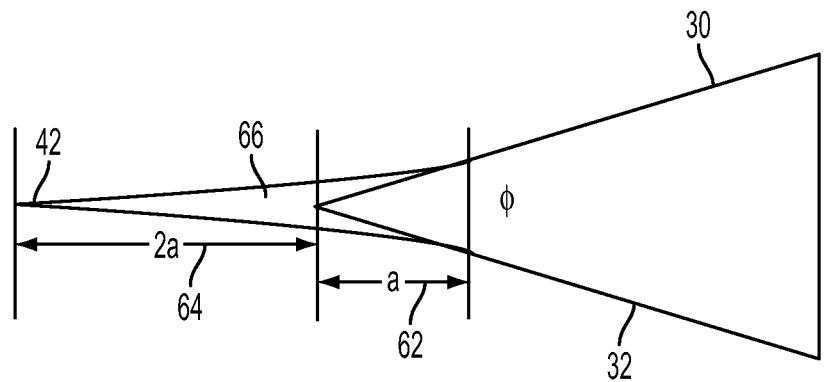
FIG. 6 shows an embodiment of a cubic wedge stress relief feature.

FIG. 6 shows another embodiment of a stress relief feature. This feature may be referred to as a cubic stress relief feature, or a cubic wedge. In this embodiment, the two cut lines 30 and 32 still meet at the apex 42 as in previous embodiments to form a pie-shaped or wedge-shaped removal area. However, the cut lines do not follow a straight, linear path. The cut lines are cubic, or at least have a cubic portion, making the wedges cubic.

Previous embodiments have implemented a process of forming the electronic device or devices on a flexible substrate according to the desired three-dimensional structure, cutting the substrate in locations to allow the two-dimensional substrate to be bent, where the cuts have stress relief features, and then shaping the substrate into the three-dimensional structure. While using the same techniques and embodiments, it is possible to also think of this process as cutting the substrate such that the cuts are arranged to increase the radius of curvature to meet some desired level of stress relief. The stress is inversely proportional to the radius of curvature, so increasing the radius of curvature reduces the stress.

The cubic wedge stress relief feature provides an example of reducing the radius of curvature, while also acting as a stress relief feature. FIG. 6 shows an embodiment of such a cubic wedge stress relief feature. Generally, it is possible to stretch the cut so that the gap G(R), shown as 66 in FIG. 6, decreases more slowly. This reduces the value of φ, which in turn increases the radius of curvature.

One approach to the shape of the cut maintains a constant radius of curvature as the gap gets smaller. The cut shape having a cut shape such that the gap 66 is, $$G(R)=sR^3.$$

Since the gap at angle φ is φR, then $$\phi=sR^2,$$

and so $$r^2=\pi/s.$$

This leads to a radius of curvature that is constant independent of R, resolving the issue. A constant radius of curvature then results from a cubic form of the cut line. The point R=a is where the radius of curvature is low enough for the original cut, although no limitation is intended or implied. The values of R depend on the specifics of the substrate and deposited thin films, as well as the cut pattern.

Referring to FIG. 6, an example of a cubic cut consists of lines 30 and 32. The gap 66 does not narrow as quickly as it had in the previous embodiments. Beginning in at a distance 62 from the previous apex, such as a, the line takes on a cubic attribute. The apex 42 now occurs at a distance 64, such as 2a, past the previous apex. The result of this increases the radius of curvature and consequently reduces stress. The shape does not need to be exactly cubic and any shape that reduces the angle φ near the apex, will reduce the stress in the formed shape.

Figure 7:
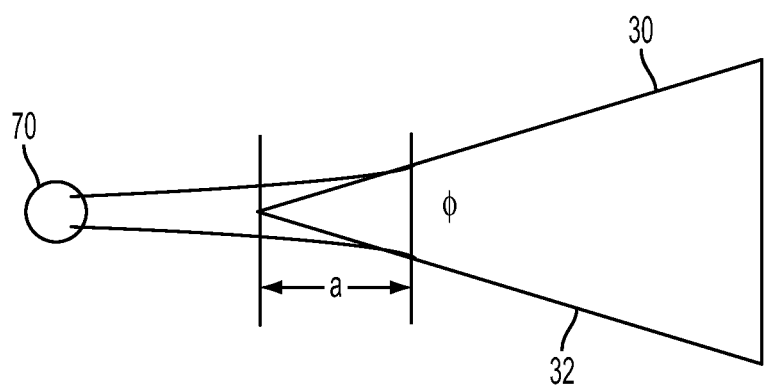
FIG. 7 shows an embodiment of a combination stress relief feature.

Any of the above embodiments and variants may be combined to afford stress relief to these devices. For example, the circular feature may be combined with the cubic wedge variation. An example of this is shown in FIG. 7. The circular feature 70 occurs towards the ends of the cubic lines 30 and 32. The apex may or may not form the center of the circular feature. Similarly, the partial cutting, retention of material, extended cuts, etc., may all be combined in many different variants to allow tailoring of stress relief resolution for shaped electronics.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A method of forming a three-dimensional electronic device, comprising:
   forming at least one electronic device on a two-dimensional, flexible substrate, the electronic device being formed according to a three-dimensional structure;
   cutting the two-dimensional, flexible substrate, the cuts being located to allow the two-dimensional substrate to be shaped, the cuts having at least one stress relief feature and that two cut lines meet to form an apex, cutting the substrate further comprising at least one of:
      cutting a circle centered at the apex, the circle forming the stress relief feature,
      altering a path of at least one of the cuts to form a cubic portion of a wedge shape, and
      extending one of the cut lines past the apex forming an extended cut, the extended cut forming the stress relief feature; and
   shaping the two-dimensional, flexible substrate to form the three-dimensional structure, the stress relief features arranged to alleviate stress in the three-dimensional structure.

2. The method of claim 1, wherein cutting the substrate further comprises cutting a circle and cutting a circle comprises cutting a complete circle and removing material inside the circle.

3. The method of claim 1 in which the three-dimensional structure is a dome, a portion of a sphere, a cone, a portion of an ellipsoid, or combinations and approximations to these shapes.

4. The method of claim 1, wherein cutting the substrate further comprises cutting a circle and cutting a circle comprises cutting a portion of the circle and retaining the material.

5. The method of claim 4, wherein retaining the material comprises retaining material that forms connections between devices.

6. The method of claim 4, wherein retaining the material comprises retaining material that contains devices, the devices forming contacts through the retained material to other areas of the device.

7. The method of claim 1, wherein cutting the substrate comprises cutting a wedge shape in which the shaped portion follows a cubic shape.

8. The method of claim 1, wherein cutting the substrate comprises cutting a wedge shape and also comprises cutting a circle at the apex.

9. A method of forming a three-dimensional electronic device, comprising:
   forming at least one electronic device on a two-dimensional, flexible substrate, the electronic device being formed according to a three-dimensional structure;
   cutting the two-dimensional, flexible substrate, the cuts being arranged to as to increase a radius of curvature to meet a stress relief parameter when the substrate is shaped, and the cuts being arranged to form an apex and one of:
      cutting a circle centered about the apex, the diameter of the circle selected to control the radius of curvature,
      extending a cut a distance beyond the vertex, the distance selected to meet the stress relief parameter, and
      altering a path of at least one of the cuts to form a cubic portion of a wedge shape; and
   shaping the two-dimensional, flexible substrate to form the three-dimensional structure.

\* \* \* \* \*